United States Patent
Kumar et al.

(10) Patent No.: US 9,953,934 B2
(45) Date of Patent: Apr. 24, 2018

(54) WARPAGE CONTROLLED PACKAGE AND METHOD FOR SAME

(71) Applicant: Intel Corporation, Santa Clara, CA (US)

(72) Inventors: Siddarth Kumar, Chandler, AZ (US); Sandeep B Sane, Chandler, AZ (US); Shubhada H. Sahasrabudhe, Gilbert, AZ (US); Shalabh Tandon, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/971,744

(22) Filed: Dec. 16, 2015

(65) Prior Publication Data

US 2017/0178987 A1    Jun. 22, 2017

(51) Int. Cl.
*H01L 23/00* (2006.01)
*H01L 23/498* (2006.01)
*H01L 23/16* (2006.01)

(52) U.S. Cl.
CPC ............ *H01L 23/562* (2013.01); *H01L 23/16* (2013.01); *H01L 23/49822* (2013.01);
(Continued)

(58) Field of Classification Search
CPC ... H01L 23/36; H01L 23/49833; H01L 23/16; H01L 24/14; H01L 25/0657; H01L 24/17;
(Continued)

(56) References Cited

U.S. PATENT DOCUMENTS

| 6,497,943 B1 * | 12/2002 | Jimarez | B32B 15/08 |
| | | | 174/255 |
| 6,528,179 B1 * | 3/2003 | Jimarez | B32B 15/08 |
| | | | 257/746 |

(Continued)

FOREIGN PATENT DOCUMENTS

| JP | 2011029669 A | 2/2011 |
| KR | 1020090074497 A | 7/2009 |

OTHER PUBLICATIONS

Arents, Hans C, "Chapter 1 Section 3: Shape memory Alloys", Scientific Report 92-94, (Last modified: May 24, 1995), 1 pg.
(Continued)

*Primary Examiner* — Alonzo Chambliss
(74) *Attorney, Agent, or Firm* — Schwegman Lundberg & Woessner, P.A.

(57) ABSTRACT

A warp controlled package includes a substrate that assumes a warped configuration according to the application of heat. At least one device is coupled along the substrate. A plurality of electrical contacts extend between at least the device and the substrate. One or more counter moment elements are coupled with the substrate. The one or more counter moment elements include a passive configuration and a counter moment configuration. In the counter moment configuration the one or more counter moment elements are configured to apply a counter moment to the substrate to counteract the warped configuration. In the passive configuration the one or more counter moment elements are configured to apply a neutral counter moment less than the counter moment of the counter moment configuration.

35 Claims, 6 Drawing Sheets

(52) U.S. Cl.
CPC .............. H01L 24/17 (2013.01); *H01L 24/13* (2013.01); *H01L 24/16* (2013.01); *H01L 24/81* (2013.01); *H01L 2224/131* (2013.01); *H01L 2224/16227* (2013.01); *H01L 2224/81815* (2013.01); *H01L 2924/15311* (2013.01); *H01L 2924/3511* (2013.01)

(58) Field of Classification Search
CPC .. H01L 23/562; H01L 23/49822; H01L 24/81
See application file for complete search history.

(56) References Cited

U.S. PATENT DOCUMENTS

| | | | | |
|---|---|---|---|---|
| 6,818,972 | B2* | 11/2004 | Jimarez | B32B 15/08 |
| | | | | 257/668 |
| 6,992,379 | B2* | 1/2006 | Alcoe | H01L 23/3735 |
| | | | | 174/255 |
| 7,355,283 | B2* | 4/2008 | Chiu | H01L 23/3121 |
| | | | | 174/261 |
| 8,487,441 | B2* | 7/2013 | Chiu | H01L 23/3121 |
| | | | | 174/261 |
| 8,878,368 | B2* | 11/2014 | Chiu | H01L 23/3121 |
| | | | | 257/775 |
| 9,230,919 | B2* | 1/2016 | Chiu | H01L 23/3121 |
| 2005/0056943 | A1* | 3/2005 | Pogge | H01L 21/6835 |
| | | | | 257/778 |
| 2008/0099890 | A1 | 5/2008 | Chen et al. | |
| 2009/0085228 | A1 | 4/2009 | Sun et al. | |
| 2010/0210042 | A1 | 8/2010 | Oh et al. | |

OTHER PUBLICATIONS

Xia, Younan, et al., "Soft Lithography", Annual Review of Materials Science vol. 28, (1998), 153-184.
Xia, Younan, et al., "Soft Lithography", Angewandte Chemie International Edition 37(5), (Mar. 16, 1998), 550-575.
"International Application Serial No. PCT/US2016/060818, International Search Report dated Feb. 16, 2017", 3 pgs.
"International Application Serial No. PCT/US2016/060818, Written Opinion dated Feb. 16, 2017", 8 pgs.

* cited by examiner

United States Patent US 9,953,934 B2

WARPAGE CONTROLLED PACKAGE AND METHOD FOR SAME

COPYRIGHT NOTICE

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice applies to the drawings that form a part of this document: Copyright Intel Corporation, Santa Clara, Calif. All Rights Reserved.

TECHNICAL FIELD

Embodiments described herein generally relate to warpage control in packages caused by heating.

BACKGROUND

Electronic packages include for instance a device (semiconductor, processor or the like) coupled along a substrate having a plurality of layers and interconnecting traces and vias. The device is coupled with the substrate with a plurality of contacts that electrically couple the device and the substrate. In at least some examples the contacts include a solder interface of solder dots between the device and the substrate. The solder dots are heated after coupling of the device to the substrate. The heat reflows the solder with the goal of reinforcing the solder connection between the device and the substrate.

The application of heat, whether for reflow of the solder, testing of package function, or during installation of the package to another system, causes expansion of the substrate. The expansion, in at least some examples, warps at least the substrate and creates stress between the contacts including reflowed solder dots. In at least some examples the contacts are opened or provide a poor connection and the device or package fail to function properly.

In some examples, a glass cloth layer is included in the substrate to increase the stiffness of the package. In other examples, the package is pinned or clipped to an overall substrate to maintain the package in a flat orientation. In still other examples, a metal or polymer frame is formed around the package to increase stiffness.

DESCRIPTION OF EMBODIMENTS

Figure 1:
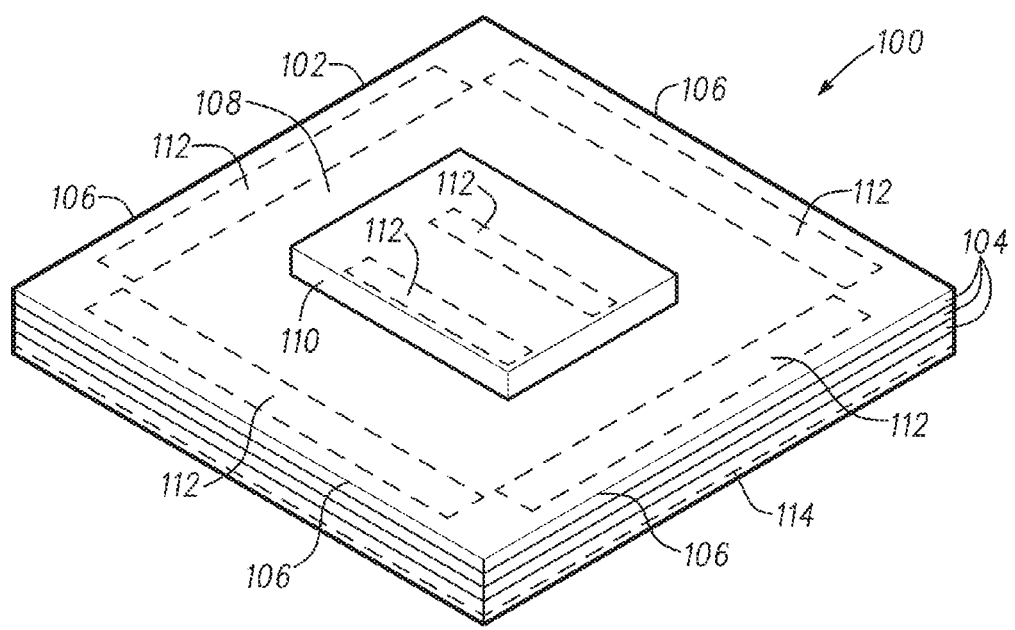
FIG. 1 is a perspective view of one example of a warp controlled package.

The present inventors have recognized, among other things, that a problem to be solved can include counteracting warping of a package at a variety of temperatures including room temperature and high temperatures (e.g., temperatures used during testing of the package and reflow of solder). In at least some examples, the application of heat causes the package to warp, for instance into a concave shape (from a planar or initial convex shape). Contact between the substrate and device are stressed and in some circumstances a solder interface is opened. In other examples, the stress at the solder interface causes a 'head and pillow' connection to form with solder dots engaging tangentially along their exterior surfaces. The connection is weak and when the package is installed, for instance in an overall device, overall substrate or the like, the force of installation may open (fracture) the connection. Alternatively, heat generated by use (e.g., through electrical resistance, operation of the package device or the like) in some examples opens the connection as the substrate warps because of the heat.

Passive solutions including glass cloths, substrates including robust cores and metal or polymer frames have been used to increase the stiffness of the package and minimize fracture at connections. As design specifications increasingly require thinner (and less robust) packages for space savings, fitting of additional components in the package or the like available space for robust cores, glass cloths and frames has correspondingly shrunk or disappeared. Additionally, these passive features that increase stiffness are relatively expensive and time intensive for assembly with the package.

The stiffness of packages and corresponding vulnerability to opening at connections is made worse with stretchable and bendable (pliable) packages including materials, such as PET and PDMS. In some pliable packages the substrate and the device are coupled while housed on a rigid substrate, the package is then peeled from the rigid substrate. After removal from the rigid substrate the pliable package is vulnerable to warping. In some examples, the pliable package is pinned or clipped to an overall substrate for testing or installation of further components. In other examples, a passive stiffener is added to the substrate to increase the package stiffness. Each of these options can be expensive and time intensive.

The present subject matter can help provide a solution to this problem, such as by the inclusion of one or more active counter moment elements with the package. The counter moment elements provide an active force or moment that counters warping (e.g., through one or more of warping of layers, shearing between layers or the like) of the substrate at temperatures including room and high temperatures. As described herein the counter moment elements include passive and counter moment configurations. In the counter moment configuration the one or more counter moment elements are activated and apply a counter moment (moment or force) to at least the substrate that is counter to the warping of the substrate. Accordingly, the one or more counter moment elements bias the substrate into a configuration more closely matching the package initial configuration (e.g., a planar or convex configuration). The counter moment elements thereby minimize stresses at the contacts between at least the device and substrate of the package and thereby improve the yield of packages at manufacture and installation.

In at least some examples the counter moment elements include shape memory alloys that are configured to transition from the passive configuration (e.g., with a neutral counter moment) to the counter moment configuration (with the specified counter moment greater than the neutral counter moment). Optionally, the one or more counter moment elements is a distributed layer included on or within the substrate that acts in a corresponding distributed fashion to apply a counter moment to the package. In other examples, the one or more counter moment elements include a plurality of counter moment elements located in a plurality of zones of the package (e.g., near edges, near heat generating devices on the package or the like). The counter moment elements are configured for activation at their respective locations and thereby provide active local counter moments at their locations upon activation. That is to say, one or more of the plurality of counter moment elements are activated as needed as temperatures in the respective zones rise and reach the temperature for transitioning to the counter moment configuration.

In still other examples, one or more heating elements are coupled near each of the one or more counter moment elements, respectively. A controller selectively operates each of the one or more heating elements (e.g., based on anticipated operation of a component, current or voltage measurements, temperature measurements or the like) to accordingly transition the respective counter moment elements to provide counter moments at one or more locations of the package. With one or more counter moment elements (operated with or without the controller) local discrete application of moments (e.g., forces, moments or the like) is realized. Accordingly, the counter moment elements are configured to actively counteract warping of the package at any zone (location) on the package experiencing warping (e.g., substrate edges, adjacent to components that generate heat or the like) that includes a counter moment element.

FIG. 1 shows one example of a package 100. As shown the package 100 includes a substrate 102, such as a substrate laminate having a plurality of layers 104. In one example, the substrate 102 includes a plurality of layers 104 built in a patterned lithography method, for instance by one or more of the application of various layers such as silicon, insulating layers for package substrates such as ABF (Ajinomoto Build-up Films) or the like and masking and etching of conductive metal layers to accordingly form conductive traces or the like. In another example, the layers 104 include a plurality of conductive vias that extend between the layers 104 and accordingly provide for electrical communication between the various layers as well as the device 110.

As further shown in FIG. 1, a device 110 is provided on an upper surface of the substrate 102. As will be shown herein, the device 110 is coupled with the package 100 with a plurality of electrical contacts. In one example, the electrical contacts are formed as solder dots between each of the device 110 and the substrate 102. As also further described herein, the solder dots are reflowed in an example by heating of the package 100 to high temperatures to cause reflow strengthen the bond of the electrical contacts between the device 110 and the substrate 102.

In another example, a plurality of electrical contacts are provided on the lower surface of the substrate 102 (for instance hidden by the perspective view shown in FIG. 1). These exemplary electrical contacts provide communication to and coupling with an underlying component including, but not limited to, an overall package, printed circuit board, motherboard or the like. The electrical contacts provided on the lower surface of the substrate 102 optionally include solder dots similar in at least some regards to the solder dots interposed between the device 110 and the substrate 102.

As described herein, the package 100 experiences a variety of temperatures including operating and testing temperatures and higher reflow temperatures to reflow the electrical contacts to improve their mechanical strength and ensure the contacts are closed. The heating of the package 100 causes one or more of the components of the package, such as the substrate 102, to warp. Warping creates stress across the electrical contacts and in some examples fractures (opens) one or more of the contacts or creates a weak connection between the device 110 and the substrate 102, such as a head and pillow joint (described herein). Further, when the package 100 is subjected to higher temperatures during operation or testing and reflow (higher temperatures relative to operating or testing temperatures) stresses are induced in electrical contacts along the lower surface of the substrate 102 by warping of one or more components of the package 100, such as the substrate 102. In a similar manner to stresses in the electrical contacts between the device 110 and the substrate 102, the stresses in the contacts between the substrate 102 and underlying components open the electrical contacts or facilitate intermittent contact between the package 100 and the underlying components with weak joints, such as head and pillow joints.

As further shown in FIG. 1, one or more counter moment elements 112, 114 are provided with the package 100. Referring first to the counter moment elements 112, exemplary elements are provided proximate one or more substrate edges 106 of the substrate 102. As will be described herein, in one example the counter moment elements 112 are provided within the substrate 102. For instance, the counter moment elements 112 are patterned in a similar manner to the conductive traces of the substrate 102. That is to say, the counter moment elements 112 are formed with a combination of masking and etching to form one or more counter elements 112 within one of the layers 104 of the substrate 102. In another example, the counter moment elements 112 are coupled with the substrate 102. For instance, the counter moment elements 112 are adhered, fastened or the like to the substrate 102 whether on the upper surface of the substrate 102 (adjacent to the device 110) or along the lower surface of the substrate 102 (concealed by the remainder of the substrate 102). FIG. 1 also shows counter moment elements 112 positioned in other locations (zones) of the package 100. For instance, counter moment elements 112 are proximate an substrate interior 108 of the substrate 102 and adjacent to the device 110. The counter moment elements 112 in each of the locations shown provide localized counter moments to counteract moments in the package 100, for instance caused by warping of the substrate 102.

Referring again to FIG. 1, another example of a counter moment element 114 is shown. In this example, the counter moment element 114 is provided as a layer 104 (film, mesh or the like) of the substrate 102. For instance, the counter moment element 114 is a counter moment layer extending or distributed across the substrate 102. For instance, as shown by the dashed lines in FIG. 1 the counter moment element 114 extends between each of the substrate edges 106 and across the substrate interior 108. In contrast to the localized or discreet counter moment elements 112 previously described herein the counter moment element 114 provides a distributed counter moment element to the package 100. Stated another way, the counter moment element 114 provides a distributed active support to the package 100 to accordingly counter moments generated by the substrate such as the substrate 102 for instance during heating (through one or more of package use including operation or testing of the device 110) as well as during bonding of the device 110 to the substrate 102 for by way of reflowing.

In contrast, the counter moment elements 112 provided at locations or zones of the package 100 including, but not limited to, along the perimeter of the substrate 102 (e.g., adjacent or near to the substrate edges 106) as well as the counter moment elements 112 proximate the device 110 provide localized counter moments to the substrate 102 to counteract moments generated by the warping of the substrate 102 (e.g., in a warped configuration for instance during heating) at those respective locations or zones. That is to say, the counter moment elements 112 counter the moments generated by the substrate 102 through the application of a counter moment, in an opposed fashion to decrease stresses between one or more contacts along the edges of the substrate 102. In a similar manner, the counter moment elements 112 positioned near another location or zone, such as the substrate interior 108, counteract moments generated by warping of the substrate 102 adjacent to the device 110 (e.g., caused by heat generated by the device 110 or heating of the package 100 generally). That is to say, the counter moment elements 112 provide counter moments at one or more zones in the package proximate to the respective counter moment elements 112.

As will be described herein, the counter moment elements 112, 114 as described herein are active elements that affirmatively apply moment to package, such as the substrate 102. The counter moment elements 112, 114 include heat activated counter moment elements that are operated by heating of the package 100 whether internally (by the device 110 or in conductive traces and vias) or from the surrounding environment. The counter moment elements 112, 114 transition from a passive configuration, where the counter moment elements apply substantially minimal or no counter moment (neutral counter moment) to the package 100 (including the substrate 102), to a counter moment configuration, where the counter moment elements 112, 114 are activated by heat and provide a counter moment (greater than the neutral counter moment) opposed to a moment generated by warping of the substrate 102. As will be further described herein, in another example the counter moment elements 112, 114 are activated by controlled heating from one or more resistive heating elements adjacent to the respective counter moment elements 112, 114.

As described herein, the counter moment elements 112, 114 are in examples constructed with one or more shape memory alloys. In one example, shape memory alloys used in the counter moment elements 112, 114 include, but are not limited to, nickel-based shape memory alloys including for instance Nitinol, copper-based shape memory alloys and stainless steel-based shape memory alloys. Exemplary shape memory alloys transition from martensitic to austenitic phases with heating and do the reverse with cooling (e.g., two way alloys). The transition causes one or more or expansion or contraction and is reversible with heating and cooling. Coupling of the counter moment elements 112, 114 with the substrate 102 ensures transmission of one or more of expansion and contraction of the shape memory allows to the package 100 (e.g., the substrate 102 subject to warping).

Figure 2:
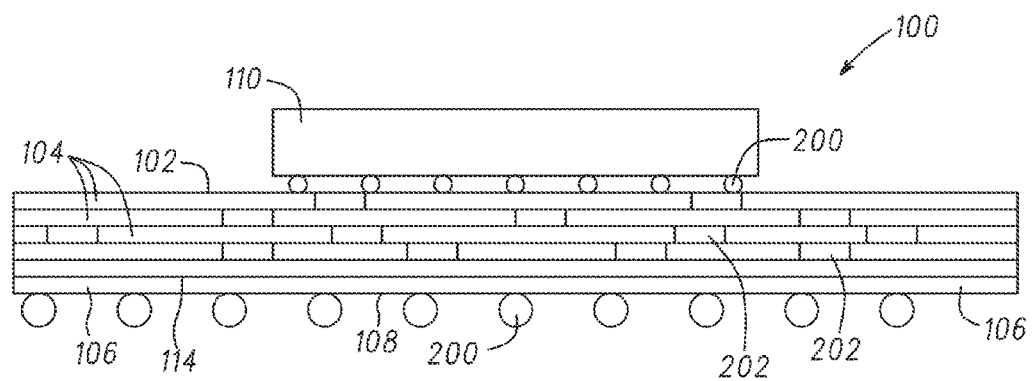
FIG. 2 is a cross sectional view of another example of a warp controlled package including a counter moment element layer.

FIG. 2 shows a cross-sectional view of one example of the package 100. As shown the device 110 is coupled along the substrate 102. In this example, the substrate 102 is a laminate including a plurality of layers 104. One of the layers 104 includes the counter moment element 114 extending through the substrate 102. As previously described herein, the counter moment element 114 includes but is not limited to one or more shape memory alloys including for instance Nitinol, copper-based shape memory alloys, stainless steel-based shape memory alloys or the like.

As further shown in FIG. 2, the plurality of layers 104 of the substrate 102 include conductive traces 202 extending through layers 104 that provide interconnections between the device 110 and a plurality of electrical contacts 200 provided along a lower surface of the substrate 102 (also shown in FIG. 2) optionally coupled with another component including, but not limited to, an overall package, printed circuit board, motherboard or the like. Electrical contacts 200 are shown interposed between the device 110 and an upper surface of the substrate 102. The electrical contacts 200 between the device 110 and the substrate 102 provide interconnections between the device 110 and the conductive traces 202 and electrical contacts 200 along the lower surface of the substrate 102.

As will be described herein, during one or more of operation of the package 100 (including use, testing or the like) or reflowing of electrical contacts 200 with generates heat in the package 100. As the package 100 is heated, the substrate 102 warps, for instance into a concave configuration. Warping generates stress between the electrical contacts 200 on the substrate and coupled with the device 110 (and optionally with another component along the lower surface). That is to say, the substrate 102 warps (e.g., at various locations including the substrate edges 106) and generates stress between the electrical contacts 200 near at least the edges of the device 110 or the substrate edges 106 coupled with an underlying printed circuit board or motherboard. The stresses in some examples are sufficient to open the electrical contacts 200 between the device 110 and the substrate 102 or between the substrate 102 and the underlying printed circuit board, motherboard or the like.

In another example, the electrical contacts 200 are weakened by stress on the electrical contacts caused by the warping of the substrate 102. In operation, for instance with renewed warping of the substrate 102 caused by heating of the package 100 the electrical contacts 200 intermittently coupled (e.g., with a head and pillow joint or the like) between the device 110 and the substrate 102 or between the substrate 102 and an underlying printed circuit board or motherboard provide intermittent electrical communication thereby frustrating operation of the package 100 or causing the package 100 to fail.

As shown in FIG. 2, the counter moment element 114 extends for instance between the substrate edges 106 (at the left and right sides of the package 100 as shown in FIG. 2) and along the substrate interior 108. The counter moment element 114 provides a distributed support feature for the package 100. As previously described herein, the counter moment element 114 transitions between a passive configuration with little to no counter moment (e.g., a neutral counter moment) applied to the substrate 102 and a counter moment configuration where the counter moment element 114 is activated by heat and applies an active counter moment to the substrate 102 that counteracts biasing of the substrate 102 into a warped (e.g., concave) shape. That is to say, the counter moment element 114 provides in one example counter moment (e.g., a convex counter moment) opposed to the moment of the substrate 102 while the substrate is heated and warps (e.g., into a concave configuration). The substrate 102 is thereby actively biased by the counter moment element 114 into a substantially planar configuration that minimize stress between the electrical contacts 200 whether between the device 110 and the substrate 102 or between the substrate 102 and another component such as a printed circuit board, motherboard or the like.

In one example, the material of the counter moment element 114 (previously described herein) is selected according to a specified transition temperature of the counter moment element. That is to say, at a known temperature the substrate 102 begins the transition into the warped configuration and under conventional circumstances applies the stresses described herein between the electrical contacts 200 shown in FIG. 2. The counter moment element material is in one example selected to have an activation temperature substantially corresponding to the transition temperature of the substrate 102. Accordingly, the counter moment element 114 operates at substantially the same temperature, is triggered at the same time and applies the counter moment to the moment otherwise generated by the substrate 102 (as it attempts to warp) to actively maintain the substrate 102 in a substantially planar configuration that minimize stresses at the electrical contacts 200.

Figure 3:
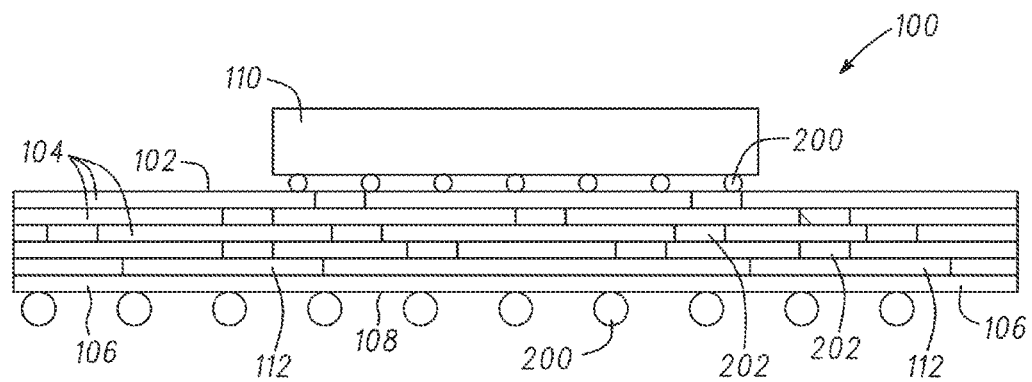
FIG. 3 is a cross sectional view of yet another example of a warp controlled package including a plurality of counter moment elements.

FIG. 3 shows another example of the package 100 including a plurality of counter moment elements 112 at discrete locations within the substrate 102. In at least some regards the cross-section of the package 100 shown in FIG. 3 is similar to the cross-section previously shown and described with regard to FIG. 2. For instance, the device 110 is coupled with the substrate 102 by a plurality of electrical contacts 200 (in some examples solder dots). In another example, the package 100 is provided with a plurality of electrical contacts 200 configured for coupling of the package 100 with another component such as a printed circuit board, motherboard or the like. The substrate 102 includes one or more layers 104 extending between substrate edges 106 and across the substrate interior 108. As further shown in FIG. 3, a plurality of conductive traces 202 extend through the layers 104 to provide interconnections between the device 110 and the electrical contacts 200 at the lower surface of the substrate 102.

In the example shown in FIG. 3, the counter moment elements 112 are provided in a layer 104 of the substrate 102. In this example, the counter moment elements 112 are localized to zones (e.g., locations) of the substrate 102. For instance, the counter moment elements 112 at the perimeter of the substrate 102 are proximate to the substrate edges 106 and relatively remote to the substrate interior 108. In one example, warping of the substrate 102 generates relatively higher stress at the substrate edges 106 of the substrate 102 compared to the substrate interior 108. The substrate 102 biases into a concave configuration that generates increased stress with the electrical contacts 200 (whether between the device 110 and the substrate 102 or the substrate 102 and an underlying component) near the substrate edges 106. The counter moment elements 112 are provided near the substrate edges 106 to provide a counter moment that discretely counteracts the moment generated in the substrate 102 at or near the substrate edges 106.

In another example, one or more counter moment elements 112 are provided at other locations in the substrate 102. For instance, as shown in FIG. 1 one or more counter moment elements 112 are shown adjacent to the device 110 (e.g., positioned within layers 104). The counter moment elements 112 provided therein are configured to counteract a moment generated by heat passed from the device 110 into the substrate 102. The heat from the device 110 in some circumstances triggers localized warping of the substrate 102 proximate the substrate interior 108. The counter moment elements 112 beneath the device 110 counter the localized moment generated by the device 110. That is the say, the moment generated in the substrate 102 at one or more of these discrete locations (e.g., at one or more of the substrate edge 106, the substrate interior or adjacent to the device 110) is countered by a counter moment (e.g., a convex counter moment) that biases the substrate 102 in an opposed manner to the warped configuration the substrate 102 would otherwise assume (for instance shown in FIG. 7B herein).

Figure 4:
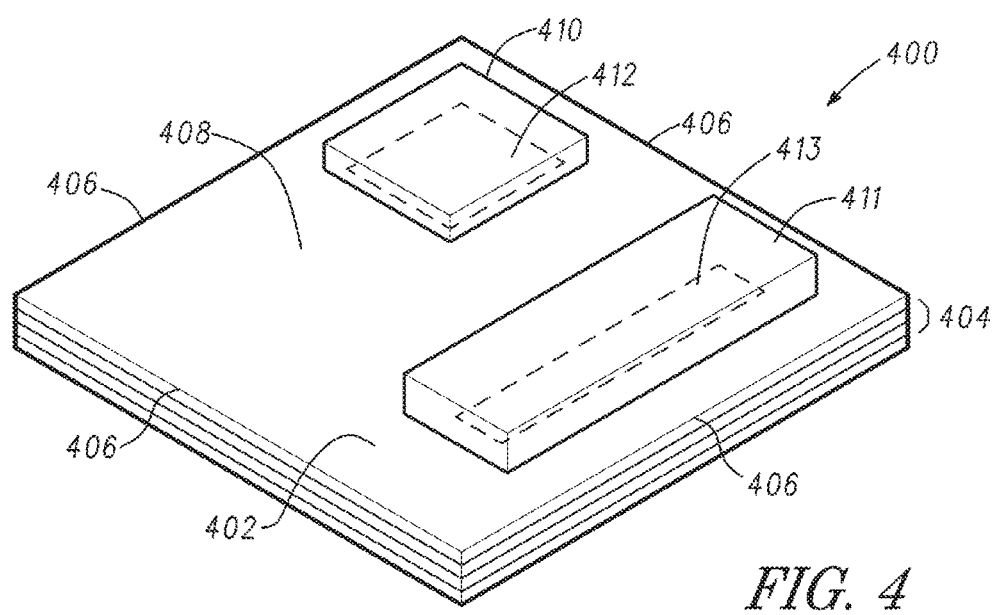
FIG. 4 is a perspective view of still another example of a warp controlled package including a plurality of counter moment elements at zones of the package.

FIG. 4 shows another example of a package 400. As shown, the package 400 includes two devices 410, 411 coupled with the substrate 402. In the example shown in FIG. 4, the substrate 402 optionally includes a plurality of layers 404, for instance forming a laminate. Substrate 402 is similar to the previously described substrate 102 in at least some regards. For instance, the substrate 402 includes a plurality of conductive traces interconnecting the devices 410, 411 with each other as well as electrical contacts (e.g., along a bottom surface of the substrate 402). In another example, the substrate 402 extends between substrate edges 406 as shown in FIG. 4 and across the substrate interior 408.

In another example, the substrate 402 is a pliable substrate for instance a substrate configured for use in a wearable device for instance a garment, article of jewelry, article of clothing or the like. The substrate 102 previously described herein similarly includes a pliable substrate in another example. The substrate 402 includes, but is not limited to, one or more polymers such as PET (polyethylene terephthalate), PDMS (poly dimethyl siloxane) or the like. Pliable substrates 104, 404 are subject to increased warpage because of their deformable character. Similarly substrates 104, 404 without a rigid core are also subject to increased warpage. Further, substrates have become increasingly thin, for instance by way of including progressively thinner layers 104, 404. The inclusion of glass cloths, rigid caps or the like adds one or more of additional thickness or rigidity to substrates and is not in some examples desirable where space or pliability are at a premium. The counter moment elements described herein (e.g., elements 412, 413 as shown in FIG. 4 and elements 112, 114 in FIG. 1) generate an active counter moment to moments generated by the substrates 102, 402 as the substrates attempt to transition into a warped configuration. The counter moment elements 412, 413 (or 112, 114) generate a counter moment without contributing substantially to the thickness of the substrate while also maintaining pliability of the substrate.

Referring again to FIG. 4 as shown, the counter moment elements 412, 413 are in this example associated with zones corresponding to the devices 410, 411 (e.g., dice). That is to say, the counter moment element 412 associated with the device 410 is provided proximate to (e.g., beneath) the device 410 in one of the layers 404. Optionally, the counter moment element 412 is provided as a separate component coupled to either of the upper surface of the substrate 402 (immediately underlying the device 410) or beneath the substrate 402, for instance along a portion of the substrate bottom. In a similar manner, the counter moment element 413 associated with the device 411 is positioned on the substrate 402 in proximate to the device 411. With this arrangement, as each of the components (devices 410, 411) generate heat the heat is transmitted to the substrate 402 and the substrate 402 attempts to transition into a warped configuration. In an example, the substrate 402 transitions to the warped configuration local to the devices 410, 411. The respective counter moment elements 412, 413 discretely counteract the localized moments generated by the substrate 402. For instance, in one example, where the substrate 402 attempts to transition the package 400 into a concaved configuration at a location adjacent to the device 410 the counter moment element 412 provides a localized counter moment (e.g., a convex counter moment) that biases the substrate 402 in an opposite fashion to maintain the substrate 402 in a planar or near planar configuration (e.g., as originally formed). In a similar manner, the counter moment element 413 associated with the device 411 generates a localized counter moment counter moment that counteracts a moment generated by the substrate 402 according to heat transmitted from the device 411 to the substrate that otherwise triggers warping of the substrate 402.

Figure 5:
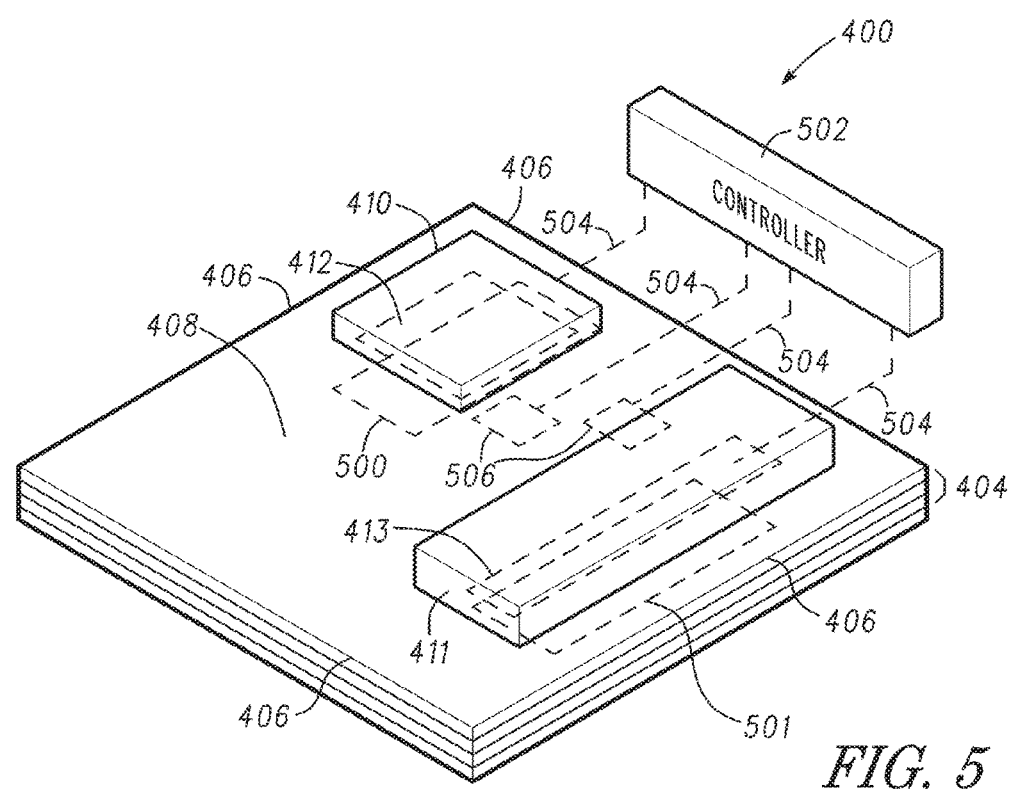
FIG. 5 is a perspective view of one example of a warp controlled package including one or more counter moment assemblies.

FIG. 5 shows another example of the package 400 including the counter moment elements 412, 413 associated with the respective devices 410, 411. The counter moment elements 412, 413 are components of counter moment assemblies configured to provide affirmative activation of the counter moment elements 412, 413. In some examples, the counter moment assemblies provide discrete control of the counter moment elements 412, 413 including when each of the counter moment elements are activated and deactivated, for instance by the selective application and cessation of heat.

As shown in FIG. 5, the counter moment element 412 is in one example associated with the device 410. As also shown in FIG. 5, a heating element 500 is provided proximate to the device 410 and the counter moment element 412. As will be described herein, the heating element 500 provides active heating to the counter moment element 412 to trigger transition of the counter moment element 412 from a passive configuration (providing little to no moment to the substrate 402) to a counter moment configuration where the counter moment element 412 provides a counter moment to warping of the substrate 402. In a similar manner, a heating element 501 is provided adjacent to the counter moment element 413. Each of the counter moment elements 412, 413 and heating elements 500, 501 are in one example formed within layers 404 of the substrate 402. In another example, the components of the counter moment assemblies including for instance counter moment elements 412, 413 and the respective heating elements 500, 501 are provided in a consolidated package or assembly that is coupled with the substrate 402 for instance along an upper layer of the substrate 402 adjacent to the devices 410, 411 or along a lower surface of the package for instance a lower surface of the substrate 402.

Optionally, one or more temperature sensors 506, such as thermal couples, are provided adjacent to one or more of the devices 410, 411. As will be described herein, in one example the temperature sensors 506 measure temperature of the substrate 402 adjacent to the devices 410, 411. The measured temperatures are used in an example by a controller to activate one or more of the counter moment elements 412, 413. Similarly, the measured temperatures are used in another example by a controller to deactivate (cease heating) one or more of the counter moment elements, for instance when the substrate 402 has cooled and is not subject to warping.

As further shown in FIG. 5, a controller 502 is in communication with each of the heating elements 500, 501. As will be described herein, the controller 502 is configured to operate each of the heating elements 500, 501 in one or more configurations for instance collectively (at the same time) or discretely (operating one or more of the heating elements 500, 501 independently). Optionally, the controller 502 is formed as a part of the package 400. That is to say, the controller 502 is in one example another device coupled with the package 400 (e.g., the substrate 402) in a similar manner to the devices 410, 411. In yet another example, the controller 502 is a separate component coupled to the package 400 by way of one or more conductors such as the conductors 504 (e.g., traces extending across another component such as a motherboard, printed circuit board or the like). For instance, the controller 502 is part of an overall processor or dedicated controller provided on a printed circuit board, a motherboard or the like.

In operation, the counter moment assemblies including the counter moment elements 412, 413 and the associated heating elements 500, 501, respectively are operated with the controller 502. In one example, the controller 502 determines anticipated load of the package 400 including but not limited to prediction of anticipated use of the package 400 during operation as an overall system. That is to say, as one or more functions that use one or both of the devices 410, 411 (of the package 400) begin or are anticipated to begin the controller 502 proactively operates one or more of the heating elements 500, 501 to activate the respective counter moment elements 412, 413. The one or more activated counter moment elements 412, 413 transition from the passive configuration to the counter moment configuration. As the devices 410, 411 operate heat is transferred to the substrate 402 and the counter moment elements 412, 413 (one or more of the elements), transitioned to the counter moment configuration, counteract moments generated by the warping of the substrate 402. In another example, the controller 502 monitors loading of the devices 410, 411 including, but not limited to, measurement of current or voltage at each of the devices 410, 411. The controller 502 operates the heating elements 500, 501 and correspondingly triggers transition of the counter moment elements 411, 413 according to the measured current or voltage loads. Similarly, the controller 502 deactivates heating at the heating elements 500, 501 and allows the one or more activated counter moment elements 412, 413 to deactivate where the anticipated load or actual load (one or more of measured operation such as processing, voltage, current) decreases, heating of the substrate 402 decreases and warping subsides.

In still another example, the controller 502 is coupled by way of conductors 504 with the temperature sensors 506 associated with each of the respective devices 410, 411. In this example, the controller 502 uses temperature measurements proximate each of the devices 410, 411 to discretely operate the heating elements 500, 501 and transition the respective counter moment elements 412, 413 between the counter moment and passive configurations. For instance, as the substrate 402 temperature rises adjacent to one or more of the devices 410, 411 the controller 502 detects the increased temperature and accordingly operates one or more of the heating elements 500, 501 according to the measured temperatures. The heating elements 500, 501 (e.g., resistive heaters) selectively provide heat to the counter moment elements 412, 413 based on the measured temperatures to activate the elements and thereby provide a counter moment to that portion of the substrate 402 experiencing the increased temperature and subject to warping.

Figure 6:
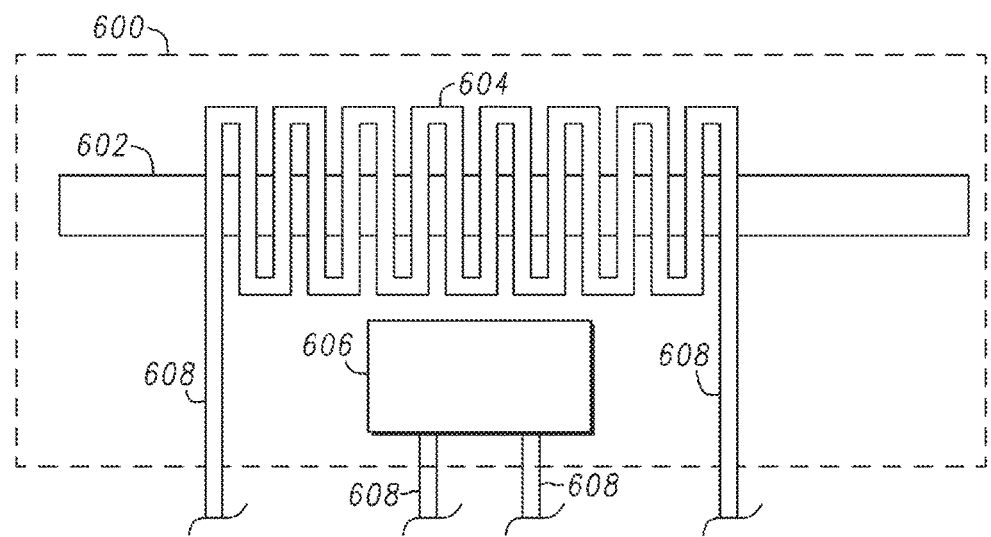
FIG. 6 is a schematic view of one example of a counter moment assembly shown in FIG. 5.

FIG. 6 shows one example of a counter moment assembly 600. In the example shown, the counter moment assembly 600 includes a counter moment element 602 such as a shape memory alloy configured to transition from a passive configuration to a counter moment configuration. That is to say, the counter moment element 602 is configured to transition from the passive configuration having minimal or no moment to a counter moment configuration where the counter moment element generates a moment (e.g., counter to the moment generated in a heated substrate transitioning to a warped configuration). As further shown in FIG. 6, the counter moment assembly 600 includes a heating element 604. The heating element 604 is in one example a resistive heating element including one or more conductors arranged in a switchback fashion over top of or beneath the counter moment element 602. In another example, the heating element 604 is adjacent, for instance next to the counter moment element 602.

Each of the components of the counter moment assembly 600 including the heating element 604 as well as the counter moment element 602 are in one example formed in one or more layers 104, 404 of the exemplary packages 100, 400 described herein. For instance, the heating element 604 and the counter moment element 602 are in one example formed by lithography (e.g., with masking and etching of layers of the packages 100, 400). In another example, the counter moment element 602 and the heating element 604 are separate components from the layers 404 of the substrates 102, 402. That is to say, the counter moment element 602 and the heating element 604 are coupled (e.g., adhered) to the substrate 402 to ensure transmission of counter moments to the substrate.

As further shown in FIG. 6, a temperature sensor 606 is in one example provided with the counter moment assembly 600. The temperature sensor 606 includes, but is not limited to, a thermocouple or other temperature sensor configured to measure a temperature adjacent to one or more locations (zones) of interest in the packages 100, 400. For instance, as shown in FIG. 5 the temperature sensors 506 are associated with each of the devices 410, 411. As shown in FIG. 6, the temperature sensor 606 is provided adjacent to the counter moment element 602. In an example where the counter moment assembly 600 is formed as a unitary or consolidated assembly the temperature sensor 606 is in one example coupled with the assembly 600. As further shown in FIG. 6, each of the heating element 604 and the optional temperature sensor 606 are provided with conductors 608 configured to provide one or more of communication and power to the heating element 604 and the temperature sensor 606, for instance from the controller 502 shown in FIG. 5.

Figure 7A:
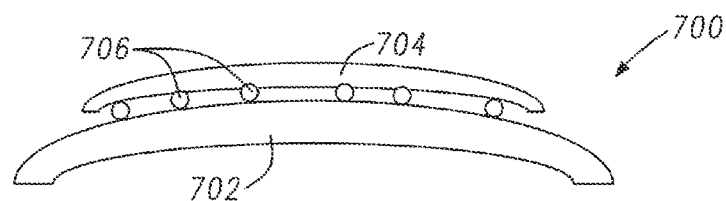
FIG. 7A is a schematic view of one example of a package in an initial configuration.
Figure 7B:
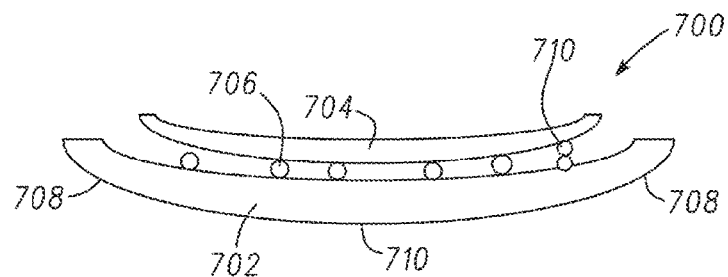
FIG. 7B is a schematic view of the package of FIG. 7A in a warped configuration.

FIGS. 7A and 7B show one example of a package 700 in cross section while in two different configurations, a passive (unwarped configuration) as in FIG. 7A, and a warped configuration as shown in FIG. 7B. The views provided in FIGS. 7A and 7B and other similar figures herein are exaggerated to illustrate warping and operation of the counter moment elements. As shown in FIG. 7A, the package 700 includes a device 704 coupled with a substrate 702 by a plurality of electrical contacts 706, such as solder dots. As further shown in FIG. 7A the package 700 is shown in an exaggerated convex shape. Optionally, the convex shape includes, but is not limited to, a slightly convex shape relative a planar (flat) shape. In another example, the substrate 702 extends in a planar fashion and the device 704 extends in a corresponding planar fashion while each of the device and the substrate are coupled together at the electrical contacts 706.

Referring now to FIG. 7B, the package 700 is shown in a (exaggerated) warped configuration. For instance the substrate 702 as well as the device 704 are heated for in a reflow process to provide increased strength of the bond between the device 704 and the substrate 702 at the electrical contacts 706. The warped configuration shown in FIG. 7B is in this example a concave shape and is exaggerated to show the spacing between the device 704 and the substrate 702. As shown in FIG. 7B the edges of the device adjacent to the substrate edges 708 are spaced apart.

The electrical contacts 706 shown in FIG. 7B provide a preliminary but weak coupling between the device 704 and the substrate 702 prior to the reflow procedure. That is to say, the solder dots are provided between the device 704 and the substrate 702 to couple the device 704 with the substrate prior to the reflow procedure. During reflow the package 700 is heated to a high temperature (much greater than room temperature to cause transition of the solder into a molten or glass transition state). The reflow of the electrical contacts 706 allows the contacts to form a stronger more reliable bond between the device 704 and the substrate 702. In the example shown in FIG. 7B the substrate 702 has an unsupported configuration (e.g., without counter moment elements) and the substrate 702 has warped into a warped configuration having the concave shape (relative to the planar or convex shape shown in FIG. 7A).

As further shown in FIG. 7B, the warped configuration of the substrate 702 pulls the electrical contacts 706 apart between the substrate 702 and the device 704. As shown in FIG. 7B the electrical contact 706 at the left most side of the device 704 and the substrate 702 is in an open configuration with the solder contact coupled along the substrate 702 but otherwise open relative to the device 704. In another example at a jointed contact 710 on the right side of the package 700 the electrical contact has formed a head and pillow configuration with a portion of the electrical contact 706 coupled with the device 704 and another portion (the pillow) coupled with the substrate 702. With the jointed contact 710 an electrical connection may be provided between the device 704 and the substrate 702. However the electrical communication is in one example intermittent and unreliable. For instance, with further processing, testing or operation of the device 704 warping of the substrate 702 may occur and open the weak jointed contact 710. The counter moment elements and associated components described herein counter warping, for instance during reflow, operation or testing of a package, and thereby minimize the creation and opening of weak bonds between the device and substrate.

Figure 8A:
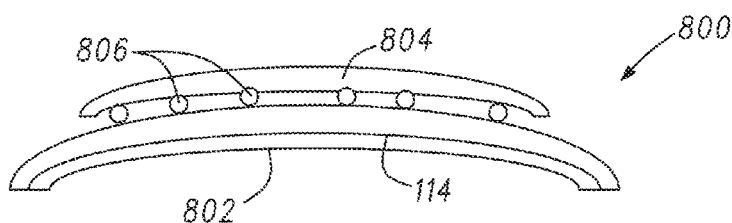
FIG. 8A is a schematic view of the package of FIG. 2 in an initial configuration.

FIG. 8A shows another example of a package 800 including one or more counter moment elements 114 within the substrate 802. The package 800 further includes a device 804 coupled with the substrate 802 by way of the electrical contacts 806. The package is shown in an exaggerated convex configuration. In another example, the package is in a planar or near planar configuration (e.g., minimally convex). As further shown in FIG. 8A the counter moment element 114 a layer or component of the substrate 802. As shown the counter moment element 114 (previously shown in FIG. 1) extends across the substrate 802, for instance between the substrate edges 808 (see FIG. 8B) and across a substrate interior 810.

Figure 8B:
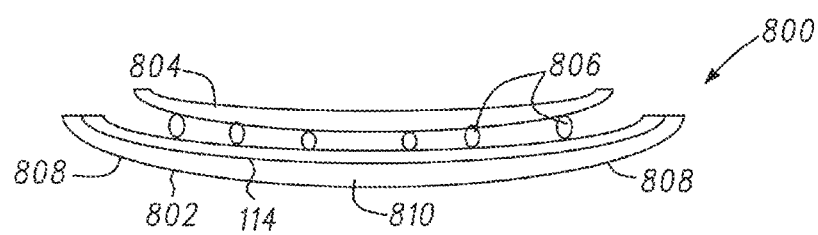
FIG. 8B is a schematic view of the package of FIG. 2 in a warped configuration.

FIG. 8B shows the same package 800 in a heated configuration. As shown the substrate 802 has changed shape relative to the shape shown in FIG. 8A. The substrate 802 has changed from either of a planar or convex shape as shown in FIG. 8A into a concave shape less pronounced than the concave configuration of FIG. 7B. The counter moment element 114 provided in the substrate 802 has transitioned from the passive configuration (no or little moment) to a counter moment configuration generating a counter moment in the substrate 802 that is counter to the otherwise warped configuration the substrate 802 would assume (see FIG. 7B). The triggered counter moment element 114 maintains the shape of the substrate 802 in a substantially planar or near planar configuration. In practice maintaining the substrate 802 in the substantially planar or near planar configuration allows reflowing of the electrical contacts 806 and creation of a robust coupling between the device 804 and the substrate 802. Stated another way, because the change in shape of the substrate 802 is minimized (e.g., eliminated or minimized) the juncture between the device 804 and the substrate 802 remains substantially similar between the configuration shown in FIG. 8A and the heated configuration shown in FIG. 8B. As shown the electrical contacts 806 extend in a consistent manner between the device 804 and the substrate 802 without open contacts or jointed or contacts (e.g., the jointed contact 710 shown in FIG. 7B). Instead, the electrical contacts 806 reflow consistently and thereby generate a robust coupling that allows for consistent electrical communication between the device 804 and the substrate 114.

In a similar manner and as previously described herein, electrical contacts are also provided along a lower surface of the substrate 802. Because the counter moment element 114 maintains the shape of the substrate 802 electrical contacts along the lower surface of the substrate 802 coupled with an underlying component (such as a printed circuit board, motherboard or the like) are maintained in a robust and reliable manner. That is to say, open contacts, jointed contacts or the like are not otherwise provided between the substrate 802 and underlying component with operation of the counter moment element 114.

Figure 9A:
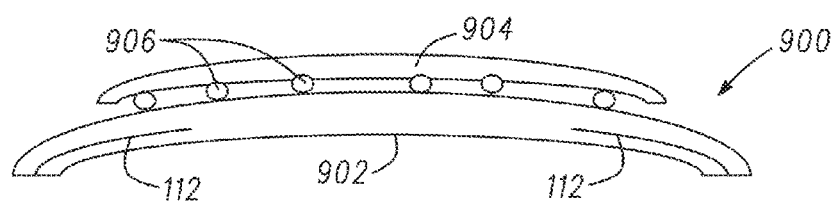
FIG. 9A is a schematic view of the package of FIG. 3 in an initial configuration.

FIG. 9A shows another example of a package 900 including one or more counter moment elements 112. In the example shown in FIG. 9A, the package 900 also includes a device 904 coupled with a substrate 902 by way of a plurality of electrical contacts 906. The package 900 includes counter moment elements 112 provided at localized positions within the substrate 902. As shown, the counter moment elements 112 in this example are provided at a zone or other discrete location within the substrates 902, for instance at or near the substrate edges 908. Further, in the example shown in FIG. 9A the counter moment elements 112 are remote relative to the substrate interior 910. In yet another example, the counter moment elements 112 are provided at other localized positions within the package 900, for instance as shown in FIGS. 4 and 5 one or more counter moment elements 412, 413 are provided proximate (beneath or adjacent to) one or more devices such as the devices 410, 411. As described herein, the localized positioning of the counter moment elements 112 (referring again to FIG. 9A) applies a localized counter moment to the respective portions of the package 900 for instance the substrate 902 at or near the substrate edges 908.

Figure 9B:
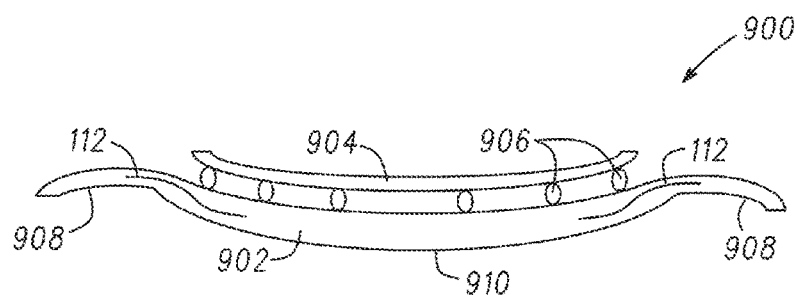
FIG. 9B is a schematic view of the package of FIG. 3 in a warped configuration.

Referring now to FIG. 9B, the package 900 is shown in a heated configuration for instance during a reflow procedure (or during operation or testing). As previously described herein, during reflow the package 900 is heated to a high temperature relative to room temperature to reflow the electrical contacts and provide a robust electrical and mechanical coupling between the device 904 and the substrate 902. Warping of the substrate 902 is in one example more pronounced near the substrate edges 908 of the substrate 902. For instance, heating of the substrate 902 allows the substrate 902 to bend in a more pronounced fashion at the substrate edges 908. With the counter moment elements 112 provided at or near the substrate edges 908 the counter moment provided by the counter moment elements 112 (e.g., a convex counter moment) opposes the warping of the substrate 902 at the most pronounced locations, the substrate edges 908. The counter moment applied by the triggered counter moment elements 112 (one or more shape memory elements) decreases the spacing between the device 904 and the substrate 902 especially at or near the substrate edges 908. As shown in FIG. 9B, the substrate 902 is in a configuration more closely approximating a planar shape than the warped configuration shown in FIG. 7B. The configuration shown in FIG. 9B is exaggerated to show the effect of the application of the counter moment from the counter elements 112 proximate the substrate edges 908. As shown, the change in the gap between the device 904 and the substrate 902 at or near the substrate edges 908 is minimized to allow for the electrical contacts 906 to readily reflow between the device 904 and the substrate 902 to generate robust electrical and mechanical couplings therebetween. Open contacts (left most contact 706 in FIG. 7B) and jointed contacts 710 (also shown in FIG. 7B) are thereby substantially minimized.

Figure 10:
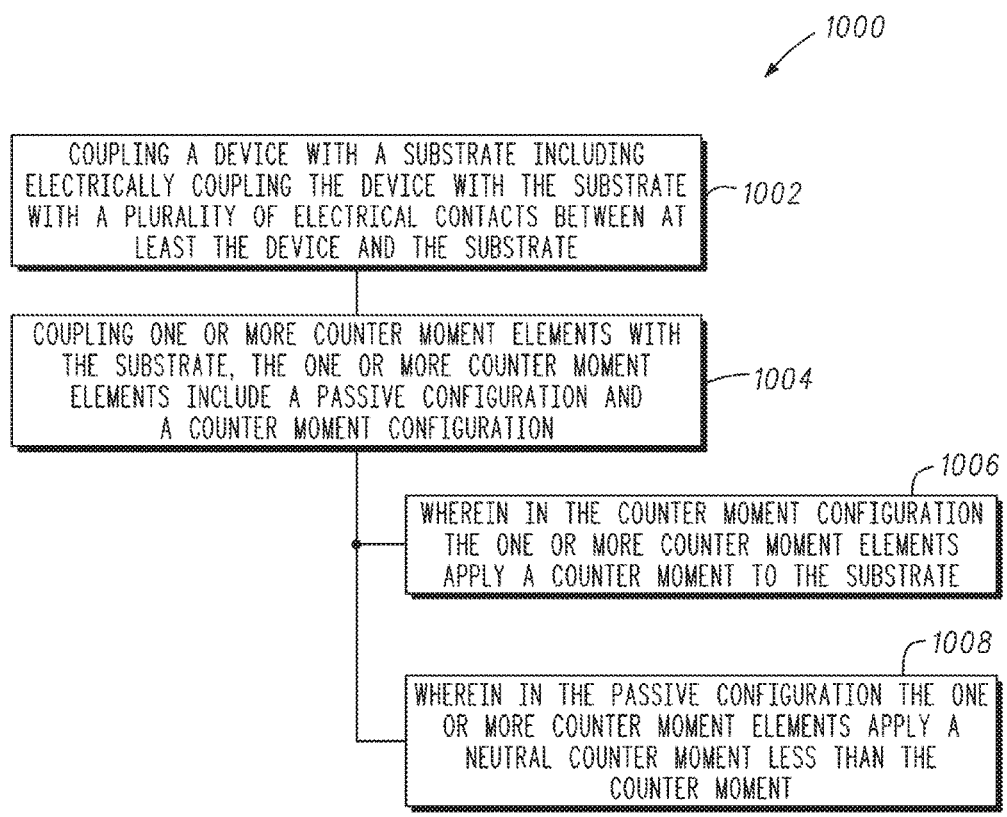
FIG. 10 is a block diagram showing one example of a method for making a warp controlled package

FIG. 10 shows one example of a method 1000 for making a warp control package for instance one or more of the packages 100, 400 shown herein. In describing the method 1000 reference is made to one or more components, features, functions and steps previously described herein. Where convenient, reference is made to the components, features, steps and the like with reference numerals. Reference numerals provided are exemplary and are nonexclusive. For instance features, functions, steps and the like described in the method 1000 include, but are not limited to, the corresponding numbered elements provided herein other corresponding features described herein (both numbered and unnumbered) as well as their equivalents.

At 1002, the method 1000 includes coupling a device (e.g., one or more of the devices 110, 410, 411) with the substrate such as the substrate 102 or other examples provided herein including electrically coupling the device with the substrate with a plurality of electrical contacts 200 between at least the device and the substrate. As previously described herein, in one example the plurality of electrical contacts include but are not limited to solder contacts provided between the device such as the device 110 and the substrate 102. The electrical contacts provide electrical communication and mechanical coupling of the device 110 (or devices) with the substrate 102.

At 1004, the one or more counter moment elements 112, 114 shown in FIGS. 1-3 (and other examples provided herein) are coupled with the substrate 102. The one or more counter moment elements 112, 114 include a passive configuration and a counter moment configuration. At 1006, in the counter moment configuration the one or more counter moment elements 112, 114 apply a counter moment to the substrate 102. At 1008, in the passive configuration the one or more counter elements 112, 114 apply a neutral counter moment less than the counter moment in the counter moment configuration. That is to say, the neutral counter moment includes one or more of a neutral moment (zero newton meters) as well as a lesser counter moment relative to the counter moment provided in the counter moment configuration of the counter moment element.

As previously described herein, the counter moment elements in one example include, but are not limited to, one or more shape memory alloys such as nickel-based shaped memory alloys, copper-based shaped memory alloys and steel-based shaped memory alloys and the like. Counter moment elements are configured for transitioning from the passive configuration (e.g., deactivated) to the counter moment configuration (activated) according to the application of heat. In one example, the counter moment elements are configured by way of the selection of shape memory alloys, configuration of the shape memory alloys (positioning within the packages) to accordingly transition from the passive configuration to the counter moment configuration at a temperature near to the temperature that causes warping of the substrate.

Several options for the method 1000 follow. In one example, the plurality of contacts include a plurality of solder contacts. In such an example, coupling of the device 104 with the substrate 102 includes heating of the substrate and the solder contacts for instance to a reflow temperature (as well as a testing or operating temperature or the like). Heating the substrate 102 includes the substrate warping, for instance toward a warped configuration (e.g., from a convex or near planar configuration to more of a concave shape). Coupling of the device 110 with the substrate 102 further includes reflowing the solder contacts between the device 104 and the substrate 102 based on the heating. That is to say, at least the package such as the package 100 is heated to a reflow temperature (relatively higher than room temperature or operating temperature for the package) to melt or allow the solder contacts to reach a glass transition temperature. Solder contacts reflow between the device 110 and the substrate 102 to form robust and reliably electrical contacts therebetween. One or more of jointed contacts for instance the jointed 710 and the left most contact 706 shown in FIG. 7B are thereby substantially minimized (e.g., eliminated or reduced).

In another example, applying the counter moment to the substrate 102 with the one or more counter moment elements 112, 114 includes countering warping of the substrate such as the substrate 102. For instance, as the substrate 102 is heated the substrate 102 (without a counter moment) transitions from a convex or near planar configuration to the concave shape (exaggerated for illustration) shown in FIG. 7B. In an example, application of the counter moment includes applying a convex counter moment relative to the concave biased substrate 102. Further, in another example applying the counter moment with the counter moment elements 112, 114 includes maintaining the reflowed solder contacts based on the applied counter moment. For instance, as shown in FIGS. 8B and 9B countering of warping of the substrates 802, 902 maintains the substrates 802, 902 in close proximity relative to the devices 802, 902 and thereby allows for reflowing of the electrical contacts (solder contact) and maintenance of a robust coupling therebetween without open or jointed contacts. In still another example, heating the substrate 102 to a temperature that would cause warping without the counter moment elements includes heating the one or more counter moment elements 112, 114 and activating the counter moment configuration to apply the counter moment to the substrate 102.

In another example, coupling one or more counter moment elements 112, 114 with the substrate 102 includes coupling a counter moment layer (e.g., the counter moment element 114) within a plurality of layers 104 of the substrate 102. The counter moment element 114 (a layered counter moment element) is optionally formed in a lamination process or in a process of masking and etching (photosensitive lithography) or the like. In still another example, coupling one or more counter moment elements (e.g., elements 112) with the substrate 102 includes coupling at least a first counter moment element 112 (or element 412) within a first zone of the substrate 102 and coupling at least a second counter moment element 112 (or element 413) within a second zone of the substrate 102 different than the first zone. For instance as shown in FIG. 1, a plurality of zones are provided with the package 100 including for instance zones provided along the perimeter of the substrate 102 at or near the substrate edges 106 and remote from the substrate interior 108. In another example, one or more counter moment elements 112 are provided in proximity to one or more devices for instance the device 110 as shown in FIG. 1. In still other examples, the counter moment elements 412, 413 are provided at or near (proximate) to one or more corresponding devices such as the respective devices 410, 411 shown in FIG. 4. Stated another way, in some examples the first and second zones include one or more locations on the substrate, for instance the substrate edges 106, the substrate interior 108, or one or more locations proximate to devices positioned on the substrate.

In still another example, the method 1000 includes heating the substrate 102 in one of the first or second zones and applying a counter moment to the substrate in the respective first or second zones with the first or second counter moment elements 112, 114 according to the heating of either of the first or second zones, respectively. That is to say, one or more discrete counter moment elements 412, 413 are coupled to the package 100 (e.g., the substrate 102 of the package). For instance, where heating occurs proximate to one or more devices, such as the device 110, the counter moment elements 112 associated with the device 110 (proximate the device) are accordingly activated (triggered, operated or the like) as heat is transmitted into the substrate 102. The shape memory alloys of the counter moment elements 112 contract, expand or the like to apply the counter moment to the package 100. In another example, where heat is generated at a central location such as the substrate interior 108 by one or more devices (e.g., the device 110) and transmitted throughout the substrate 102 for instance to the substrate edges 106 localized counter moments are applied at or near the substrate edges 106 by the corresponding counter moment elements 112 positioned along the substrate edges 106. In still another example and as previously described herein, localized counter moments are provided at other zones for instance zones associated with one or more devices such as the devices 410, 411 by the corresponding counter moment elements 412, 413. That is to say, one or more counter moments are coupled to the package (e.g., the packages 100, 400) according to heat generated in the package at localized or distributed (overall) positions according to the arrangement of the counter moment elements on the substrate.

In another example, the method 1000 includes coupling a first heating element with a first counter moment element 412 (see FIG. 5). In another example, a second heating element 501 is coupled with a second counter moment element 413 (also shown in FIG. 5). A controller 502 is coupled with each of the heating elements 500, 501 as shown in FIG. 5. Optionally the controller 502 is coupled with one or more temperature sensors 506 (e.g., thermocouples) provided at or near the respective counter moment elements 412, 413 and the respective zones (corresponding to the devices 410, 411 on the package 400).

In another example, the method 1000 includes selectively applying a counter moment in one or more of the first or second zones (locations of the substrate proximate to one or more devices or components coupled with the substrate). Selectively applying a counter moment includes one or more of initiating heating with the first heating element 500 by way of the controller 502 activating the respective counter moment element (e.g., elements 412) and applying at least a first counter moment in the first zone proximate the device 410. In another example, the method 1000 includes initiating heating with the second heating element 501 with the controller 502. Heating of the second heating element applies a second counter moment in the second zone by way of activating the counter moment element 413 proximate to the device 411.

EXAMPLES

Example 1 can include subject matter such as a warp controlled package comprising: a substrate laminate including a plurality of layers, the substrate laminate assumes a warped configuration according to the application of heat; at least one device coupled along the substrate laminate; a plurality of electrical contacts extending between at least the device and the substrate laminate; and one or more counter moment elements coupled with the substrate laminate, the one or more counter moment elements include a passive configuration and a counter moment configuration: wherein in the counter moment configuration the one or more counter moment elements are configured to apply a counter moment to the substrate laminate to counteract the warped configuration, and wherein in the passive configuration the one or more counter moment elements are configured to apply a neutral counter moment less than the counter moment of the counter moment configuration.

Example 2 can include, or can optionally be combined with the subject matter of Example 1, to optionally include wherein the one or more counter moment elements are within the plurality of layers of the substrate laminate.

Example 3 can include, or can optionally be combined with the subject matter of one or any combination of Examples 1 or 2 to optionally include wherein the one or more counter moment elements include a counter moment layer extending across layers of the plurality of layers of the substrate laminate.

Example 4 can include, or can optionally be combined with the subject matter of one or any combination of Examples 1-3 to optionally include wherein the one or more counter moment elements are heat activated to transition from the passive configuration to the counter moment configuration.

Example 5 can include, or can optionally be combined with the subject matter of one or any combination of Examples 1-4 to optionally include wherein the one or more counter moment elements include a shape memory alloy.

Example 6 can include, or can optionally be combined with the subject matter of Examples 1-5 to optionally include wherein the shape memory alloy consists of at least one of Nitinol, copper based shape memory alloys and stainless steel shape memory alloys.

Example 7 can include, or can optionally be combined with the subject matter of Examples 1-6 to optionally include wherein the substrate laminate includes at least a first zone and a second zone different from the first zone, the one or more counter moment elements includes at least a first counter moment element and a second counter moment element, wherein the first counter moment element is within the first zone, and the first counter moment element is configured to apply the counter moment to the substrate laminate in the first zone, and wherein the second counter moment element is within the second zone, and the second counter moment element is configured to apply the counter moment to the substrate laminate in the second zone.

Example 8 can include, or can optionally be combined with the subject matter of Examples 1-7 to optionally include a first heating element coupled with the first counter moment element, and a second heating element coupled with the second counter moment element.

Example 9 can include, or can optionally be combined with the subject matter of Examples 1-8 to optionally include a controller electrically coupled with each of the first and second heating elements, and the controller is configured to selectively operate one or more of the first or second heating elements to apply heat to one or more of the first and second counter moment elements and to apply the counter moment in one or more of the first or second zones, respectively.

Example 10 can include, or can optionally be combined with the subject matter of Examples 1-9 to optionally include wherein the one or more counter moment elements is near an edge of the substrate laminate and remote from a center of the substrate laminate.

Example 11 can include, or can optionally be combined with the subject matter of Examples 1-10 to optionally include wherein the at least one device includes a first device and a second device and the one or more counter moment elements include first and second counter moment elements, each of the first and second counter moment elements near the first and second devices, respectively.

Example 12 can include, or can optionally be combined with the subject matter of Examples 1-11 to optionally include wherein the substrate laminate has a concave shape in the warped configuration, the counter moment includes a convex counter moment, and in the counter moment configuration the one or more counter moment elements are configured to apply the convex counter moment to the concave shape.

Example 13 can include, or can optionally be combined with the subject matter of Examples 1-12 to optionally include wherein the plurality of electrical contacts include solder contacts, and the substrate laminate is biased toward the warped configuration near a reflow temperature of the solder contacts.

Example 14 can include, or can optionally be combined with the subject matter of Examples 1-13 to optionally include wherein the substrate laminate includes a pliable substrate laminate.

Example 15 can include, or can optionally be combined with the subject matter of Examples 1-14 to optionally include a warp controlled package comprising: a substrate including a warped configuration according to the application of heat; at least one device coupled along the substrate; a plurality of electrical contacts extending between at least the device and the substrate; and one or more counter moment assemblies coupled with the substrate, the one or more counter moment assemblies include: a shape memory element coupled with the substrate, the shape memory element transitions between a passive configuration and a counter moment configuration according to the application of heat, and at least one heating element coupled with the shape memory element, and the at least one heating element is configured to selectively heat the shape memory element.

Example 16 can include, or can optionally be combined with the subject matter of Examples 1-15 to optionally include wherein the one or more counter moment assembly includes first and second counter moment assemblies and the substrate includes at least a first zone and a second zone, wherein the first counter moment assembly is within the first zone, and the shape memory element of the first counter moment assembly is configured to apply a first counter moment to the substrate in the first zone in the counter moment configuration, and wherein the second counter moment assembly is within the second zone, and the shape memory element of the second counter moment assembly is configured to apply a second counter moment to the substrate in the second zone in the counter moment configuration.

Example 17 can include, or can optionally be combined with the subject matter of Examples 1-16 to optionally include wherein the shape memory element includes a shape memory layer extending across the substrate, and the at least one heating element includes a first heating element in a first zone of the of the substrate and a second heating element in a second zone of the substrate.

Example 18 can include, or can optionally be combined with the subject matter of Examples 1-17 to optionally include a controller electrically coupled with the one or more counter moment assemblies, and the controller is configured to selectively operate the at least one heating element to heat the shape memory alloy element and transition the shape memory alloy element from the passive configuration to the counter moment configuration.

Example 19 can include, or can optionally be combined with the subject matter of Examples 1-18 to optionally include wherein the one or more counter moment assemblies include a temperature sensor, and the controller is in communication with the temperature sensor.

Example 20 can include, or can optionally be combined with the subject matter of Examples 1-19 to optionally include wherein the shape memory element is within a plurality of layers of the substrate.

Example 21 can include, or can optionally be combined with the subject matter of Examples 1-20 to optionally include wherein the shape memory element is near an edge of the substrate and remote from a center of the substrate.

Example 22 can include, or can optionally be combined with the subject matter of Examples 1-21 to optionally include wherein the shape memory element consists of at least one of Nitinol, copper based shape memory alloys and stainless steel shape memory alloys.

Example 23 can include, or can optionally be combined with the subject matter of Examples 1-22 to optionally include wherein the substrate laminate has a concave shape in the warped configuration, and the shape memory element is configured to apply a convex counter moment in the counter moment configuration opposed to the concave shape.

Example 24 can include, or can optionally be combined with the subject matter of Examples 1-23 to optionally include wherein the plurality of electrical contacts include solder contacts, and the substrate assumes the warped configuration near a reflow temperature of the solder contacts.

Example 25 can include, or can optionally be combined with the subject matter of Examples 1-24 to optionally include wherein the substrate includes a pliable substrate.

Example 26 can include, or can optionally be combined with the subject matter of Examples 1-25 to optionally include a method of making a warp controlled package comprising: coupling a device with a substrate including electrically coupling the device with the substrate with a plurality of electrical contacts between at least the device and the substrate; and coupling one or more counter moment elements with the substrate, the one or more counter moment elements include a passive configuration and a counter moment configuration: wherein in the counter moment configuration the one or more counter moment elements apply a counter moment to the substrate, and wherein in the passive configuration the one or more counter moment elements apply a neutral counter moment less than the counter moment.

Example 27 can include, or can optionally be combined with the subject matter of Examples 1-26 to optionally include wherein coupling one or more counter moment elements with the substrate includes coupling a counter moment layer within a plurality of layers of the substrate.

Example 28 can include, or can optionally be combined with the subject matter of Examples 1-27 to optionally include wherein coupling one or more counter moment elements with the substrate includes: coupling at least a first counter moment element within a first zone of the substrate, and coupling at least a second counter moment element within a second zone of the substrate different than the first zone.

Example 29 can include, or can optionally be combined with the subject matter of Examples 1-28 to optionally include coupling a first heating element with the first counter moment element, coupling a second heating element with the second counter moment element.

Example 30 can include, or can optionally be combined with the subject matter of Examples 1-29 to optionally include electrically coupling a controller with each of the first and second heating elements.

Example 31 can include, or can optionally be combined with the subject matter of Examples 1-30 to optionally include wherein the plurality of electrical contacts includes a plurality of solder contacts, and coupling the device with the substrate includes: heating the substrate and the solder contacts, heating the substrate includes warping the substrate toward a warped configuration, and reflowing the solder contacts between the device and the substrate based on the heating.

Example 32 can include, or can optionally be combined with the subject matter of Examples 1-31 to optionally include applying the counter moment to the substrate with the one or more counter moment elements, and applying the counter moment includes countering warping of the substrate.

Example 33 can include, or can optionally be combined with the subject matter of Examples 1-32 to optionally include wherein applying the counter moment includes maintaining the reflowed solder contacts based on the applied counter moment.

Example 34 can include, or can optionally be combined with the subject matter of Examples 1-33 to optionally include wherein heating the substrate includes heating the one or more counter moment elements, and heating the one or more counter moment elements triggers applying the counter moment.

Example 35 can include, or can optionally be combined with the subject matter of Examples 1-34 to optionally include heating the substrate in one of the first or second zones, and applying a counter moment to the substrate in the first or second zones with the first or second counter moment element according to the heating of either of the first or second zones, respectively.

Example 36 can include, or can optionally be combined with the subject matter of Examples 1-35 to optionally include selectively applying a counter moment in one or more of the first or second zones including one or more of: initiating heating with the first heating element with the controller, and applying a first counter moment in the first zone with the first counter moment element based on the heating with the first heating element, or initiating heating with the second heating element with controller, and applying a second counter moment in the second zone with the second counter moment element based on the heating with the second heating element.

All features of the apparatuses described above (including optional features) may also be implemented with respect to the methods or processes described herein.

The invention claimed is:

1. A warp controlled package comprising:
    a substrate laminate including a plurality of layers, the substrate laminate assumes a warped configuration according to the application of heat;
    at least one device coupled along the substrate laminate;
    a solder interface interposed between at least the device and the substrate laminate; and
    one or more counter moment elements coupled with the substrate laminate, the one or more counter moment elements include a passive configuration and a counter moment configuration, and one or more counter moment elements are heat activated to transition from the passive configuration to the counter moment configuration:
        in the counter moment configuration the one or more counter moment elements are configured to apply a counter moment to the substrate laminate to counteract the warped configuration and maintain the solder interface between the device and the substrate laminate, and
        in the passive configuration the one or more counter moment elements are configured to apply a neutral counter moment less than the counter moment of the counter moment configuration.

2. The warp controlled package of claim 1, the one or more counter moment elements are within the plurality of layers of the substrate laminate.

3. The warp controlled package of claim 1, the one or more counter moment elements include a counter moment layer extending across layers of the plurality of layers of the substrate laminate.

4. The warp controlled package of claim 1, the one or more counter moment elements include a shape memory alloy.

5. The warp controlled package of claim 4, the shape memory alloy consists of at least one of Nitinol, copper based shape memory alloys and stainless steel shape memory alloys.

6. The warp controlled package of claim 1, the substrate laminate includes at least a first zone and a second zone different from the first zone, the one or more counter moment elements includes at least a first counter moment element and a second counter moment element,
    the first counter moment element is within the first zone, and the first counter moment element is configured to apply the counter moment to the substrate laminate in the first zone, and
    the second counter moment element is within the second zone, and the second counter moment element is configured to apply the counter moment to the substrate laminate in the second zone.

7. The warp controlled package of claim 6 comprising:
    a first heating element coupled with the first counter moment element, and a second heating element coupled with the second counter moment element.

8. The warp controlled package of claim 6 comprising a controller electrically coupled with each of the first and second heating elements, and the controller is configured to selectively operate one or more of the first or second heating elements to apply heat to one or more of the first and second counter moment elements and to apply the counter moment in one or more of the first or second zones, respectively.

9. The warp controlled package of claim 1, the one or more counter moment elements is near an edge of the substrate laminate and remote from a center of the substrate laminate.

10. The warp controlled package of claim 1, the at least one device includes a first device and a second device and the one or more counter moment elements include first and second counter moment elements, each of the first and second counter moment elements near the first and second devices, respectively.

11. The warp controlled package of claim 1, the substrate laminate has a concave shape in the warped configuration, the counter moment includes a convex counter moment, and in the counter moment configuration the one or more counter moment elements are configured to apply the convex counter moment to the concave shape.

12. The warp controlled package of claim 1, the plurality of electrical contacts include solder contacts, and the substrate laminate is biased toward the warped configuration near a reflow temperature of the solder contacts.

13. The warp controlled package of claim 1, the substrate laminate includes a pliable substrate laminate.

14. A warp controlled package comprising:
    a substrate including a warped configuration according to the application of heat;
    at least one device coupled along the substrate;
    a solder interface interposed between at least the device and the substrate; and
    one or more counter moment assemblies coupled with the substrate, the one or more counter moment assemblies include:
        a shape memory element coupled with the substrate, the shape memory element is heat activated and transitions between a passive configuration and a counter moment configuration according to the application of heat, the counter moment configuration counteracts the warped configuration and maintains the solder interface, and
        at least one heating element coupled with the shape memory element, and the at least one heating element is configured to selectively heat the shape memory element.

15. The warp controlled package of claim 14, the one or more counter moment assembly includes first and second counter moment assemblies and the substrate includes at least a first zone and a second zone,
    the first counter moment assembly is within the first zone, and the shape memory element of the first counter moment assembly is configured to apply a first counter moment to the substrate in the first zone in the counter moment configuration, and
    the second counter moment assembly is within the second zone, and the shape memory element of the second counter moment assembly is configured to apply a second counter moment to the substrate in the second zone in the counter moment configuration.

16. The warp controlled package of claim 14, the shape memory element includes a shape memory layer extending across the substrate, and the at least one heating element includes a first heating element in a first zone of the substrate and a second heating element in a second zone of the substrate.

17. The warp controlled package of claim 14 comprising a controller electrically coupled with the one or more counter moment assemblies, and the controller is configured to selectively operate the at least one heating element to heat the shape memory alloy element and transition the shape memory alloy element from the passive configuration to the counter moment configuration.

18. The warp controlled package of claim 17, the one or more counter moment assemblies include a temperature sensor, and the controller is in communication with the temperature sensor.

19. The warp controlled package of claim 14, the shape memory element is within a plurality of layers of the substrate.

20. The warp controlled package of claim 14, the shape memory element is near an edge of the substrate and remote from a center of the substrate.

21. The warp controlled package of claim 14, the shape memory element consists of at least one of Nitinol, copper based shape memory alloys and stainless steel shape memory alloys.

22. The warp controlled package of claim 14, the substrate laminate has a concave shape in the warped configuration, and the shape memory element is configured to apply a convex counter moment in the counter moment configuration opposed to the concave shape.

23. The warp controlled package of claim 14, the plurality of electrical contacts include solder contacts, and the substrate assumes the warped configuration near a reflow temperature of the solder contacts.

24. The warp controlled package of claim 14, the substrate includes a pliable substrate.

25. A method of making a warp controlled package comprising:
    coupling a device with a substrate including electrically coupling the device with the substrate with a solder interface interposed between at least the device and the substrate; and
    coupling one or more counter moment elements with the substrate, the one or more counter moment elements include a passive configuration and a counter moment configuration, and the one or more counter moment elements are heat activated to transition from the passive configuration to the counter moment configuration:
        in the counter moment configuration the one or more counter moment elements apply a counter moment to the substrate and maintain the solder interface between the device and the substrate laminate, and
        in the passive configuration the one or more counter moment elements apply a neutral counter moment less than the counter moment.

26. The method of claim 25, coupling one or more counter moment elements with the substrate includes coupling a counter moment layer within a plurality of layers of the substrate.

27. The method of claim 25, coupling one or more counter moment elements with the substrate includes:
    coupling at least a first counter moment element within a first zone of the substrate, and
    coupling at least a second counter moment element within a second zone of the substrate different than the first zone.

28. The method of claim 27 comprising:
    coupling a first heating element with the first counter moment element,
    coupling a second heating element with the second counter moment element.

29. The method of claim 28 comprising electrically coupling a controller with each of the first and second heating elements.

30. The method of claim 29 comprising selectively applying a counter moment in one or more of the first or second zones including one or more of:
    initiating heating with the first heating element with the controller, and applying a first counter moment in the first zone with the first counter moment element based on the heating with the first heating element, or
    initiating heating with the second heating element with controller, and applying a second counter moment in the second zone with the second counter moment element based on the heating with the second heating element.

31. The method of claim 27 comprising:
    heating the substrate in one of the first or second zones, and
    applying a counter moment to the substrate in the first or second zones with the first or second counter moment element according to the heating of either of the first or second zones, respectively.

32. The method of claim 25, the plurality of electrical contacts includes a plurality of solder contacts, and coupling the device with the substrate includes:
    heating the substrate and the solder contacts, heating the substrate includes warping the substrate toward a warped configuration, and
    reflowing the solder contacts between the device and the substrate based on the heating.

33. The method of claim 32 comprising applying the counter moment to the substrate with the one or more counter moment elements, and applying the counter moment includes countering warping of the substrate.

34. The method of claim 33, applying the counter moment includes maintaining the reflowed solder contacts based on the applied counter moment.

35. The method of claim 32, heating the substrate includes heating the one or more counter moment elements, and heating the one or more counter moment elements triggers applying the counter moment.

* * * * *